(12) United States Patent
Ohta

(10) Patent No.: US 9,960,351 B2
(45) Date of Patent: May 1, 2018

(54) METHOD FOR PRODUCING ORGANIC SEMICONDUCTOR FILM AND ORGANIC TRANSISTOR

(71) Applicant: FUJIFILM Corporation, Tokyo (JP)

(72) Inventor: Hiroshi Ohta, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days. days.

(21) Appl. No.: 15/447,852

(22) Filed: Mar. 2, 2017

(65) Prior Publication Data

US 2017/0179388 A1    Jun. 22, 2017

Related U.S. Application Data

(63) Continuation of application No. PCT/JP2015/072925, filed on Aug. 13, 2015.

(30) Foreign Application Priority Data

Sep. 29, 2014  (JP) ................. 2014-199122

(51) Int. Cl.
*H01L 51/00* (2006.01)
*H01L 51/05* (2006.01)

(52) U.S. Cl.
CPC ...... *H01L 51/0007* (2013.01); *H01L 51/0005* (2013.01); *H01L 51/0012* (2013.01); *H01L 51/0096* (2013.01); *H01L 51/0558* (2013.01)

(58) Field of Classification Search
None
See application file for complete search history.

(56) References Cited

U.S. PATENT DOCUMENTS

2010/0090199 A1*  4/2010  Obuchi ............... H01L 51/0007
257/40

FOREIGN PATENT DOCUMENTS

JP    2011-258824 A    12/2011
JP    2012-049291 A    3/2012

OTHER PUBLICATIONS

International Search Report issued in PCT/JP2015/072925; dated Oct. 6, 2015.
Written Opinion issued in PCT/JP2015/072925; dated Oct. 6, 2015.
(Continued)

*Primary Examiner* — Michelle Mandala
(74) *Attorney, Agent, or Firm* — Studebaker & Brackett PC

(57) ABSTRACT

A method for producing an organic semiconductor film includes performing, in random order, applying an ink including an organic semiconductor, a first solvent having high affinity for the organic semiconductor, and a second solvent having lower affinity for the organic semiconductor than the first solvent and having a higher boiling point than the first solvent, to a lyophilic region of a substrate having at least one of a lyophilic region or a liquid repellent region disposed in the vicinity of the lyophilic region on a surface, and applying a solvent composed of the same type of solvent as the first solvent and used for controlling a volatilization rate of the first solvent in the ink applied to the lyophilic or the liquid repellant region; and then causing the first and second solvent in the ink applied to the lyophilic region to volatilize to produce an organic semiconductor film.

20 Claims, 4 Drawing Sheets

(56) References Cited

OTHER PUBLICATIONS

An Office Action; "Notification of Reasons for Refusal" issued by the Japanese Patent Office dated Oct. 17, 2017, which corresponds to Japanese Patent Application No. 2016-551620 and is related to U.S. Appl. No. 15/447,852; with English Concise Explanation.
International Preliminary Report on Patentability issued in PCT/JP2015/072925, dated Apr. 13, 2017.

* cited by examiner

METHOD FOR PRODUCING ORGANIC SEMICONDUCTOR FILM AND ORGANIC TRANSISTOR

CROSS-REFERENCE TO RELATED APPLICATIONS

This application is a Continuation of PCT International Application No. PCT/JP2015/072925 filed on Aug. 13, 2015, which claims priority under 35 U.S.C. § 119(a) to Japanese Patent Application No. 2014-199122 filed on Sep. 29, 2014. The above application is hereby expressly incorporated by reference, in its entirety, into the present application.

BACKGROUND OF THE INVENTION

1. Field of the Invention

The present invention relates to a method for producing an organic semiconductor film and an organic transistor.

2. Description of the Related Art

Since weight reduction, cost reduction and flexibility can be achieved, an organic thin film transistor (organic TFT) is used for liquid crystal displays, organic electro luminescence (EL) displays, radio frequency identifiers (RFID), and the like.

In the production of an organic thin film transistor, there is a possibility that an organic semiconductor film having a large area can be produced at a low cost with less energy consumption by a printing technique through a solution (ink) obtained by dissolving an organic semiconductor in an organic solvent or the like at a high concentration.

As such a method for producing an organic semiconductor film, various methods are proposed. For example, JP2011-258824A discloses an aspect of using two types of solvents. More specifically, in JP2011-258824A, a method for producing an organic semiconductor film by using an organic semiconductor solution including an organic semiconductor, a first solvent which is a good solvent for the organic semiconductor, and a second solvent which is a poor solvent for the organic semiconductor and has a higher boiling point than that of the first solvent is proposed.

SUMMARY OF THE INVENTION

On the other hand, in the case in which an organic semiconductor film is applied to various applications (for example, an organic semiconductor film of an organic TFT), it is preferable that the organic semiconductor crystals in the organic semiconductor film are large.

When the present inventors have produced an organic semiconductor film by the method disclosed in JP2011-258824A using the organic semiconductor solution disclosed in the document, the size of the organic semiconductor crystals in the organic semiconductor film has not been always satisfactory from the viewpoint of application to various applications and further improvement has been required.

The present invention has been made in consideration of the above circumstances and an object thereof is to provide a method for producing an organic semiconductor film including organic semiconductor crystals having a larger crystal size.

Another object of the present invention is to provide an organic transistor including an organic semiconductor film produced by the above production method.

As a result of intensive investigations on the above problems, the present inventors have found that an organic semiconductor film including organic semiconductor crystals having a larger crystal size can be obtained by applying a solvent for controlling the volatilization rate of a solvent in an ink including an organic semiconductor to a liquid repellent region of a substrate having a lyophilic region and the liquid repellent region, and thus completed the present invention.

That is, the present inventors have found that the above problems can be solved by adopting the following constitutions.

(1) A method for producing an organic semiconductor film comprising:
  performing, in random order,
    a step of applying an ink including an organic semiconductor, a first solvent having a high affinity for the organic semiconductor, and a second solvent having a lower affinity for the organic semiconductor than that of the first solvent and having a higher boiling point than that of the first solvent, to a lyophilic region of a substrate having at least one of a lyophilic region or a liquid repellent region disposed in the vicinity of the lyophilic region on a surface, and
    a step of applying a solvent for volatilization rate control composed of the same type of solvent as the first solvent in the ink and used for controlling a volatilization rate of the first solvent in the ink applied to the lyophilic region to the liquid repellent region of the substrate; and
  then performing a step of causing the first solvent and the second solvent in the ink applied to the lyophilic region to volatilize to produce an organic semiconductor film.

(2) The method for producing an organic semiconductor film according to (1), in which a volumetric amount of the first solvent in the ink applied to the lyophilic region is larger than a volumetric amount of the solvent for volatilization rate control applied to the liquid repellent region.

(3) The method for producing an organic semiconductor film according to (1) or (2), in which a plurality of the lyophilic regions having different sizes and/or shapes are disposed on the substrate, and when the solvent for volatilization rate control is applied to the liquid repellent region in the vicinities of the respective lyophilic regions, at least one of the amount, position, or number of locations of the solvent for volatilization rate control applied is adjusted according to the sizes and/or shapes of the lyophilic regions.

(4) The method for producing an organic semiconductor film according to any one of (1) to (3), in which the solvent for volatilization rate control is applied to a plurality of locations in the liquid repellent region so as to surround the lyophilic region.

(5) The method for producing an organic semiconductor film according to any one of (1) to (4), in which the lyophilic region is an ink accumulation region and an ink narrowing region connected to the ink accumulation region and having a narrower width than that of the ink accumulation region.

(6) The method for producing an organic semiconductor film according to (5), in which at least one location at a boundary between the ink narrowing region and the liquid repellent region has an acute location, and a boundary between the ink accumulation region and the liquid repellent region does not include an acute location.

(7) The method for producing an organic semiconductor film according to (5) or (6), in which the solvent for volatilization rate control is applied to the liquid repellent region on the side close to the ink accumulation region.

(8) The method for producing an organic semiconductor film according to any one of (1) to (7), in which the application of the ink and the application of the solvent for volatilization rate control are performed by an ink jet method.

(9) An organic transistor comprising: an organic semiconductor film produced by the production method according to any one of (1) to (8).

According to the present invention, it is possible to provide a method for producing an organic semiconductor film including organic semiconductor crystals having a larger crystal size.

According to the present invention, it is also possible to provide an organic transistor including an organic semiconductor film produced by the above production method.

DESCRIPTION OF THE PREFERRED EMBODIMENTS

Figure 1A:
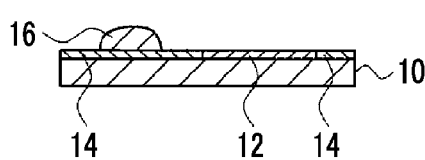
FIGS. 1A, 1C, 1E and 1G are cross-sectional views sequentially showing steps of a method for producing an organic semiconductor film according to an embodiment.

Hereinafter, a method for producing (method for forming) an organic semiconductor film according to the present invention will be described.

The numerical range which is shown by "to" used in the present specification means the range including the numerical values described before and after "to" as the lower limit and the upper limit, respectively.

First, the features of the present invention compared with the related art (JP2011-258824A) will be described in detail. One feature of the present invention is to apply an ink including an organic semiconductor, a first solvent which is a good solvent for the organic semiconductor, and a second solvent which is a poor solvent for organic semiconductor and has a lower boiling point than that of the first solvent to a lyophilic region of a substrate and apply a solvent for volatilization rate control composed of the same type of solvent as the first solvent included in the ink to a liquid repellent region. In JP2011-258824A, it is considered that a desired crystal size cannot be obtained because of the volatilization rates of the solvents. That is, when the ink including the organic semiconductor, the first solvent, and the second solvent is applied to a substrate, the first solvent having a low boiling point easily volatilizes. When the first solvent volatilizes, the ratio of the second solvent which is a poor solvent increases and the organic semiconductor is easily precipitated. Thus, the seed crystal of an organic semiconductor crystal is formed. On the other hand, it is considered that since the volatilization rate of the first solvent is too high in the related art, the precipitation of the organic semiconductor occurs in various locations, and as a result, a plurality of seed crystals are formed so that an organic semiconductor crystal to be formed do not grow sufficiently.

The present inventors control the volatilization rate of the first solvent in the ink by applying the ink to the lyophilic region on the substrate and applying the solvent for volatilization rate control composed of the same type of solvent as the first solvent which is a good solvent included in the ink to the liquid repellent region. That is, when the solvent for volatilization rate control composed of the same type of solvent as the first solvent is applied to the liquid repellent region, the applied first solvent volatilizes, the pressure of the atmosphere near the ink applied to the lyophilic region easily reaches the saturated vapor pressure of the first solvent, and as a result, the volatilization rate of the first solvent in the ink decreases. That is, since the first solvent slowly volatilizes from the ink, the number of seed crystals to be formed decreases and as a result, the size of an organic semiconductor crystal to be formed increases.

An embodiment of the method for producing an organic semiconductor film according to the present invention will be described below with reference to the attached drawings.

The embodiment of the method for producing an organic semiconductor film includes performing, in random order, Step A of applying an ink including predetermined components to a lyophilic region of a substrate (ink applying step) and Step B of applying a solvent for volatilization rate control to a liquid repellent region of the substrate (solvent for volatilization rate control applying step), and then performing Step C of causing the solvents in the ink to volatilize to produce an organic semiconductor film (solvent volatilization step).

In the description to be described below, an embodiment in which regarding the order of Steps A and B, Step B is first performed and then Step A is performed will be described but the present invention is not limited to this order. Step A may be first performed and then Step B may be performed. Steps A and B may be performed at the same time.

FIGS. 1A, 1C, 1E and 1G are cross-sectional views sequentially showing steps of a method for producing an organic semiconductor film according to the present invention. While referring to the drawings, materials used in each step and the procedure thereof will be described in detail below.

First, Steps A and B will be described in detail below.

<Step A (Ink Applying Step) and Step B (Solvent for Volatilization Rate Control Applying Step)>

In the embodiment, as described above, Step B of applying a solvent for volatilization rate control to a liquid repellent region on a substrate is performed and then Step A of applying an ink including predetermined components to a lyophilic region on the substrate is performed. According to the embodiment, since the solvent for volatilization rate control is first applied to the substrate, the volatilization rate of the first solvent in the ink is more easily controlled.

In the following description, materials (components in the ink) and members used in Steps A and B will be first described in detail and then the procedure of the steps will be described in detail.

(Organic Semiconductor)

The type of organic semiconductor to be used is not particularly limited and known organic semiconductors can be used. Specific examples thereof include pentacenes such as 6,13-bis(triisopropylsilylethynyl) pentacene (TIPS pentacene), tetramethyl pentacene, and perfluoropentacene, anthradithiophenes such as TES-ADT and 2, 8-difluoro-5, 11-bis(triethylsilylethynyl)anthradithiophene (diF-TES-ADT), benzothienobenzothiophenes such as 2,7-diphenyl[1]benzothieno[3,2-b][1]benzothiophene (DPh-BTBT) and benzothienobenzothiophene (Cn-BTBT), dinaphthothienothiophenes such as dinaphtho[2,3-b:2',3'-f]thieno[3,2-b]thiophene (Cn-DNTT), dioxaanthanthrenes such as perixanthenoxanthene, rubrenes, fullerenes such as C60 and [6,6]-phenyl-C61-butyric acid methyl ester (PCBM), phthalocyanines such as copper phthalocyanine and fluorinated copper phthalocyanine, polythiophenes such as poly(3-alkylthiophene) (P3RT), poly[5,5'-bis(3-dodecyl-2-thienyl 1)-2, 2'-bithiophene] (PQT), and poly(3-hexylthiophene) (P3HT), and polythienothiophenes such as poly[2,5-bis(3-dodecylthiophen-2-yl)thieno[3,2-b]thiophene] (PBTTT).

As described later, it is preferable that the solubility parameter (SP) value $(MPa)^{1/2}$ of the organic semiconductor satisfies a predetermined relationship between the SP value $(MPa)^{1/2}$ of the first solvent and the SP value $(MPa)^{1/2}$ of the second solvent.

The SP value $(MPa)^{1/2}$ of the organic semiconductor is measured by using a calculation method defined by Fedors (R. F. Fedors, Polymer Engineering Science, 14, p. 147-154 (1974)).

(First Solvent and Second Solvent)

The first solvent is an organic solvent having a high affinity for the organic semiconductor. The high affinity means that the solubility of the organic semiconductor is high and corresponds to a so-called good solvent for the organic semiconductor.

The type of the first solvent is not particularly limited and an optimal organic solvent is appropriately selected according to the type of the organic semiconductor. Examples of the organic solvent include alcohol solvents such as methanol, ethanol, isopropanol, normal butanol, secondary butanol, normal hexanol, 1,3-butanediol, 1,2-propanediol, and cyclohexanol; ketone solvents such as acetone, methyl ethyl ketone, methyl isobutyl ketone, diisobutyl ketone, cyclohexanone, cyclopentanone, and benzaldehyde; ester solvents such as ethyl acetate, butyl acetate, normal amyl acetate, methyl sulfate, ethyl propionate, dimethyl phthalate, ethyl benzoate, propylene glycol monomethyl ether acetate, and methoxypropyl acetate; hydrocarbon solvents such as toluene, xylene, benzene, ethylbenzene, tetralin, and hexadecane; halogenated hydrocarbon solvents such as carbon tetrachloride, trichlorethylene, chloroform, 1,1,1-trichloroethane, methylene chloride, monochlorobenzene, and dichlorobenzene; ether solvents such as tetrahydrofuran, diethyl ether, ethylene glycol monomethyl ether, ethylene glycol monoethyl ether, 1-methoxy-2-propanol, and propylene glycol monomethyl ether; amide solvents such as dimethylformamide and dimethylacetamide; and sulfonic acid solvents such as dimethylsulfoxide and sulfolane.

A suitable embodiment of the first solvent include an organic solvent X having an SP value of S1 satisfying the relationship of Expression (1) below when the SP value $(MPa)^{1/2}$ of the organic semiconductor is A.

$$A-1.5<S1<A+1.5 \qquad \text{Expression (1)}$$

That is, the SP value (S1) $(MPa)^{1/2}$ of the organic solvent X is preferably within a range of greater than (A−1.5) and less than (A+1.5) based on A which is the SP value of the organic semiconductor. When the SP value of the first solvent is within the above range, the affinity for the organic semiconductor becomes higher and the solubility of the organic semiconductor becomes higher. Within the range, from the viewpoint of being capable of achieving a higher affinity for the organic semiconductor and preparing a high concentration ink, the range of the SP value (S1) of the organic solvent X preferably satisfies the relationship of Expression (2).

$$A-1.0<S1<A+1.0 \qquad \text{Expression (2)}$$

For example, the SP value of TIPS pentacene which is an organic semiconductor is calculated as 19.4 $(MPa)^{1/2}$. Accordingly, it is preferable for the first solvent suitable for the organic semiconductor to use an organic solvent having an SP value $(MPa)^{1/2}$ of greater than 17.9 and less than 20.9 with reference to Expression (1) above. Examples of organic solvents having an SP value $(MPa)^{1/2}$ within the above range include toluene (18.2), tetralin (19.9), chloroform (19.0), chlorobenzene (19.4), o-dichlorobenzene (20.5), and anisole (19.5). It should be noted that the numbers in the parentheses of the above solvents indicate the SP value $(MPa)^{1/2}$ of each solvent.

Regarding the SP value of the first solvent, the SP values are described in the Polymer Handbook (Second Edition), Chapter IV: "Solubility Parameter Values", and the values described therein are regarded as the SP values of the present invention. In addition, the unit for the SP value is $(MPa)^{1/2}$, and the SP values described herein are those as measured at 25° C. When the data of SP value are not described in the above document, a value calculated by the method described in R. F. Fedors, Polymer Engineering Science, 14, p. 147-154 (1974) is used as the SP value in the present invention.

In addition, the SP value of the second solvent, which will be described later, is defined in the same manner as described above.

The solubility (% by mass) of the organic semiconductor with respect to the first solvent is not particularly limited but from the viewpoint of increasing the size of an organic semiconductor crystal to be formed (hereinafter, also simply referred to as "from the viewpoint of further enhancing the effect of the present invention"), the solubility is preferably 1.5% by mass or more and more preferably 3.0% by mass or more. The upper limit is not particularly limited but typically, the upper limit is 10% by mass or less in many cases. From the viewpoint of handleability, the upper limit is preferably 5% by mass or less.

The solubility (% by mass) means the maximum mass (% by mass) of the organic semiconductor that can be uniformly dissolved with respect to the mass of the first solvent at 25° C. For example, in the case in which the organic semiconductor can be dissolved in an amount of up to 10 g with respect to 100 g of the first solvent, the solubility (% by mass) is 10% by mass.

The boiling point of the first solvent is not particularly limited as long the boiling point of the first solvent is lower than the boiling point of the second solvent, which will be described later, but from the viewpoint of further enhancing the effect of the present invention, the boiling point of the first solvent is preferably 100° C. to 250° C. and more preferably 150° C. to 210° C.

The boiling point (° C.) is measured under 1 atmosphere.

The second solvent is an organic solvent having a low affinity for the organic semiconductor. The low affinity means that the solubility of the organic semiconductor is low and corresponds to a so-called poor solvent of the organic semiconductor.

The type of the second solvent is not particularly limited and an optimal organic solvent is appropriately selected according to the type of the organic semiconductor. Examples of the organic solvent include the solvents described in the examples of the first solvent.

A suitable embodiment of the second solvent include an organic solvent Y having an SP value of S2 satisfying the relationship of Expression (3) or (4) below when the SP value (MPa)$^{1/2}$ of the organic semiconductor is A.

$$A-10.0<S2<A-4.0 \quad \text{Expression (3)}$$

$$A+4.0<S2<A+10.0 \quad \text{Expression (4)}$$

That is, it is preferable that the SP value (S2) (MPa)$^{1/2}$ of the organic solvent Y is within a range of greater than (A−10.0) and less than (A−4.0) or within a range of greater than (A+4.0) and less than (A+10.0) based on A which is the SP value of the organic semiconductor. When the SP value of the second solvent is within the above range, both a low affinity for the organic semiconductor and more satisfactory mixability with the first solvent can be attained. Within the above range, from the viewpoint of further enhancing the effect of the present invention, the range of the SP value (S2) of the organic solvent Y preferably satisfies the relationship of Expression (5) or (6) below.

$$A-7.5<S2<A-5.0 \quad \text{Expression (5)}$$

$$A+5.0<S2<A+7.5 \quad \text{Expression (6)}$$

The solubility (% by mass) of the organic semiconductor with respect to the second solvent is not particularly limited but from the viewpoint of further enhancing the effect of the present invention, the solubility is preferably 1.0% by mass or less and more preferably 0.1% by mass or less. The lower limit is not particularly limited and typically, the lower limit is 0.001% by mass or more in many cases. From the viewpoint of handleability, the lower limit is preferably 0.005% by mass or more.

The solubility (% by mass) means the maximum mass (% by mass) of the organic semiconductor that can be uniformly dissolved with respect to 100 g of the second solvent at 25° C. For example, in the case in which the organic semiconductor can be uniformly dissolved with respect to 100 g of the second solvent in an amount of up to 1 g, the solubility (% by mass) is 1% by mass.

The boiling point of the second solvent is higher than the boiling point of the first solvent. A difference between the boiling point of the second solvent and the boiling point of the first solvent is not particularly limited but from the viewpoint of further enhancing the effect of the present invention, the difference is preferably 2° C. to 150° C. and more preferably 3° C. to 130° C.

The boiling point of the second solvent is not particularly limited as long as the boiling point of the second solvent and the boiling point of the first solvent satisfy a predetermined relationship but from the viewpoint of further enhancing the effect of the present invention, the boiling point of the second solvent is preferably 120° C. to 300° C. and more preferably 150° C. to 290° C.

The boiling point (° C.) is measured under 1 atmosphere.

The relationship between the surface tension of the second solvent and the surface tension of the first solvent is not particularly limited but from the viewpoint of further enhancing the effect of the present invention, the surface tension of the second solvent is preferably larger than the surface tension of the first solvent.

The surface tension is measured by using a stalagmometer according to JIS K-3362.

The aforementioned first solvent and second solvent are mixed with each other. The term "mix" means that in an environment at normal temperature and pressure, the first solvent and the second solvent are uniformly mixed at any ratio.

An absolute value of the difference (MPa)$^{1/2}$ between the SP value of the first solvent and the SP value of the second solvent is not particularly limited but from the viewpoint of further enhancing the effect of the present invention by more uniformly mixing the both, the absolute value is preferably more than 2.5 and less than 10 and more preferably 3.0 or more and 5.0 or less.

(Method for Producing Ink)

The ink is obtained by dissolving the organic semiconductor in a mixed solvent of the aforementioned first solvent and second solvent.

The method for producing the ink is not particularly limited and for example, a method for adding the organic semiconductor a predetermined amount of the mixed solvent and performing stirring and/or an ultrasonic treatment as required may be used.

The content of the organic semiconductor in the ink is not particularly limited but from the viewpoint of further enhancing the effect of the present invention, the content is preferably 0.01 to 3.0 parts by mass and more preferably 0.1 to 2.0 parts by mass with respect to a total mass of 100 parts by mass of the ink.

The volume ratio between the first solvent and the second solvent (volumetric amount of first solvent/volumetric amount of second solvent) in the ink is not particularly limited but from the viewpoint of further enhancing the effect of the present invention, the volume ratio is preferably 1 to 99 and more preferably 3 to 19.

(Solvent for Volatilization Rate Control)

The solvent for volatilization rate control used in Step B is composed of the same type of solvent as the first solvent in the ink. That is, the same type of solvent as the first solvent used in the ink is used. The solvent for volatilization rate control is used to control the volatilization rate of the first solvent in the ink applied to the lyophilic region as described above.

As the solvent for volatilization rate control, the aforementioned first solvent in the ink is used and specific examples thereof include the solvents mentioned in the description of the aforementioned first solvent.

(Substrate)

The substrate is not particularly limited as long as the substrate has a lyophilic region (ink-philic resion) and a liquid repellent region (ink repellent region) on the surface thereof. Known substrates (such as a resin substrate, a glass substrate, a metal substrate, and a silicon substrate) may be used. For example, as materials constituting resin substrates (plastic film and plastic plate), polyesters such as polyethylene terephthalate (PET) and polyethylene naphthalate (PEN); polyolefins such as polyethylene (PE), polypropylene (PP), polystyrene, and ethylene-vinyl acetate (EVA);

and vinyl resins such as polyvinyl chloride and polyvinylidene chloride; in addition to polyether ether ketone (PEEK), polysulfone (PSF), polyether sulfone (PES), polycarbonate (PC), polyamide, polyimide, acrylic resin, and triacetyl cellulose (TAC) may be used.

The substrate has at least one of a lyophilic region or a liquid repellent region disposed in the vicinity of the lyophilic region on the surface thereof. Here, the lyophilic region is a region where a solution easily spreads and the liquid repellent region is a region where a solution does not easily spread. Therefore, when the ink is applied to the substrate, the ink is easily repelled in the liquid repellent region and the ink easily stays in the lyophilic region.

The presence of the lyophilic region and the liquid repellent region on the surface of the substrate means that, in other words, there are two regions having different contact angles with respect to the ink on the surface of the substrate. An absolute value of a difference between the contact angle with respect to the ink in the lyophilic region and the contact angle with respect to the ink in the liquid repellent region is not particularly limited but from the viewpoint of the ink more easily staying in one region, the absolute value is preferably 20° or higher and more preferably 25° or more. Although the upper limit is not particularly limited, the upper limit is 90° or less in many cases.

In addition, the lyophilic region is preferably a region in which the contact angle with respect to the ink is 15° or less, and the liquid repellent region is preferably a region in which the contact angle with respect to the ink is 40° or more.

For the method for measuring the contact angle, the ink is added dropwise on the lyophilic region (or on the liquid repellent region) at 25° C. and the contact angle after 1 second has passed from the dropwise addition is measured.

The method for preparing the lyophilic region and the liquid repellent region is not particularly limited and known methods may be adopted. For example, for a lyophilization treatment, a method for subjecting a substrate to light irradiation (irradiation with ultraviolet rays (UV)) may be used. For a liquid repellent treatment, a method for applying a known liquid repellent agent (water repellent age) (for example, hexamethyldisilazane) to a substrate may be used.

When the lyophilic region and the liquid repellent region are prepared, the lyophilization treatment or the liquid repellent treatment may be performed on a part of the surface of the substrate and both the treatments may be performed in a predetermined location.

The shape of the lyophilic region on the substrate is not particularly limited and may be, for example, a square shape, a corner-rounded rectangular shape, a circular shape, an elliptic shape, a triangular shape, and the like. As described later, the lyophilic region may have a region in which the crystal is easily precipitated.

The number of lyophilic regions on the substrate is not particularly limited and the substrate may have at least one lyophilic region or a plurality of lyophilic regions. In the case in which a plurality of lyophilic regions are present, the sizes (area) and/or the shapes of the respective lyophilic regions may be different from each other.

(Procedure of Step B)

Figure 1B:
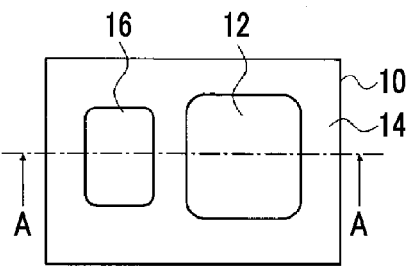
FIG. 1B is a top view showing a substrate shown in FIG. 1A.

In Step B, a solvent for volatilization rate control is applied to the liquid repellent region of the substrate. More specifically, as shown in FIGS. 1A and 1B, a substrate 10 having a lyophilic region 12 and a liquid repellent region 14 on the surface thereof is prepared and a solvent 16 for volatilization rate control is applied to the liquid repellent region 14 of the substrate 10. FIG. 1A is a cross-sectional view showing the substrate taken along line A-A in FIG. 1B.

As described above, the solvent for volatilization rate control is the same type of solvent as the first solvent included in the ink.

The method for applying the solvent for volatilization rate control is not particularly limited and known methods such as an ink jet method, a spin coating method, a kneader coating method, a bar coating method, a blade coating method, a dip coating method, a curtain coating method, a casting method, and a screen transfer method may be adopted. Among these, from the viewpoint of easily applying the first solvent at a predetermined position, an ink jet method is preferable.

The volume per droplet when the solvent for volatilization rate control is jetted in the ink jet method is not particularly limited but from the viewpoint of further enhancing the effect of the present invention, the volume is preferably 1 to 1,000 pL and more preferably 10 to 100 pL.

As an ink jet apparatus, a known apparatus including an ink jet may be used.

In FIGS. 1A to 1H, an embodiment in which the solvent for volatilization rate control is applied to one location in the liquid repellent region but the embodiment is not limited thereto. As described later, the solvent for volatilization rate control may be applied to a plurality of locations in the liquid repellent region.

In addition, the position to which the solvent for volatilization rate control is applied is not particularly limited as long as the position is on the liquid repellent region, but the solvent for volatilization rate control is preferably applied to the region near (in the vicinity of) the lyophilic region.

(Procedure of Step A)

Figure 1C:
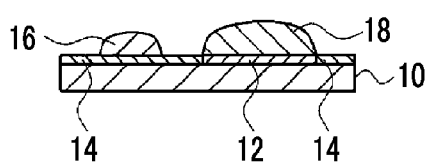
Figure 1D:
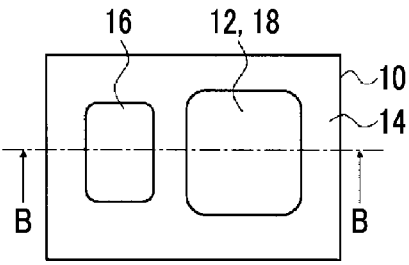
FIG. 1D is a top view showing a substrate shown in FIG. 1C.

In Step A, an ink is applied to the lyophilic region of the substrate. More specifically, as shown in FIGS. 1C and 1D, an ink 18 is applied to the lyophilic region 12 of the substrate 10. FIG. 1C is a cross-sectional view showing the substrate taken along line B-B in FIG. 1D.

The method for applying the ink is not particularly limited and the ink jet method, which is mentioned in the description of the method for applying the solvent for volatilization rate control in Step B above, is preferable.

The relationship between the volumetric amount of the ink applied to the lyophilic region in Step A and the volumetric amount of the solvent for volatilization rate control applied to the liquid repellent region in Step B is not particularly limited but from the viewpoint of further enhancing the effect of the present invention, the volumetric amount of the first solvent in the ink applied to the lyophilic region is preferably larger than the volumetric amount of the solvent for volatilization rate control applied to the liquid repellent region.

<Step C (Solvent Volatilization Step)>

Figure 1E:
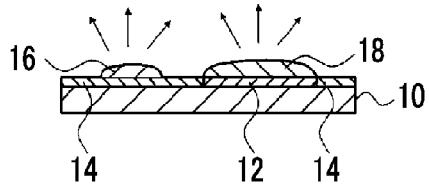
Figure 1F:
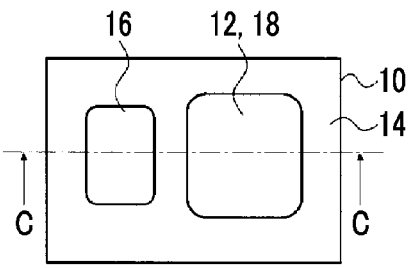
FIG. 1F is a top view showing a substrate shown in FIG. 1E.
Figure 1G:
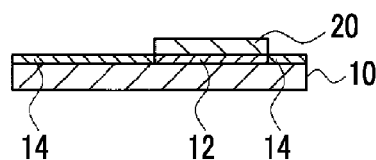
Figure 1H:
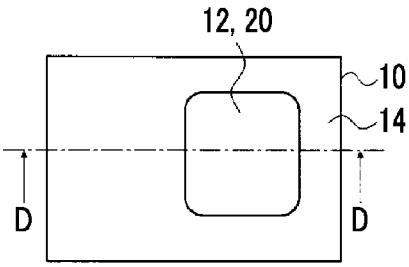
FIG. 1H is a top view of a substrate shown in FIG. 1G.

Step C is a step of causing the first solvent and the second solvent in the ink applied to the lyophilic region to volatilize to produce an organic semiconductor film. More specifically, as indicated by the arrow in FIG. 1E, the first solvent and the second solvent volatilize from the ink 18 and as shown in FIGS. 1G and 1H, an organic semiconductor film 20 is produced in the lyophilic region 12. FIG. 1E is a cross-sectional view showing the substrate taken along line C-C in FIG. 1F, and FIG. 1G is a cross-sectional view showing the substrate taken along line D-D in FIG. 1H.

As shown in FIG. 1E, when the first solvent and the second solvent volatilize from the ink 18, the same type of solvent as the first solvent which is the solvent for volatilization rate control applied to the liquid repellent region 14 also volatilizes and the saturated vapor pressure of the first solvent in the vicinity of the ink 18 is affected. Thus, the volatilization rate of the first solvent from the ink 18 decreases and as a result, organic semiconductor crystals having a large size are formed.

The method for causing the first solvent and the second solvent in the ink to volatilize is not particularly limited and a method for leaving the solvents to stand at room temperature, a method for leaving the solvents to stand under heating conditions, a method for air drying the solvents, and the like may be used.

As described above, the temperature condition when the first solvent and the second solvent volatilize is not particularly limited and the condition may be room temperature or under heating. In the case of performing heating, the temperature is preferably equal to or lower than the boiling point of the first solvent.

Modification Example 1

Figure 2:
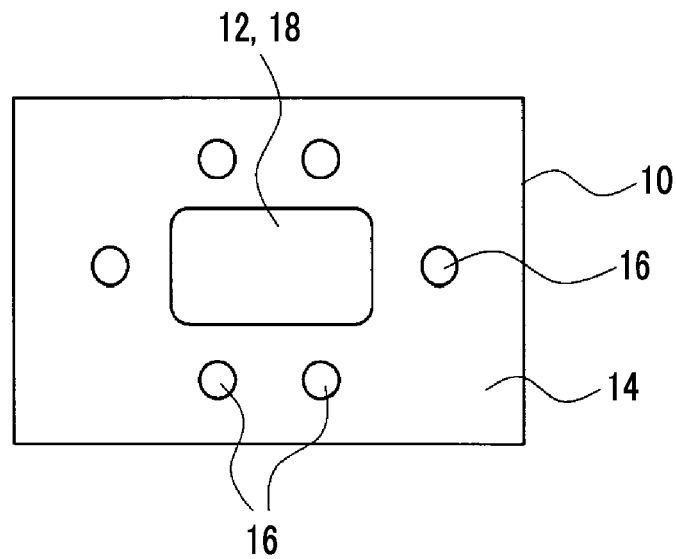
FIG. 2 is a view for illustrating the procedure of Modification Example 1 of the method for producing an organic semiconductor film and is a top view showing a substrate when an ink and a solvent for volatilization rate control are applied to the substrate.

In FIGS. 1A to 1H, an embodiment in which the solvent 16 for volatilization rate control is applied to one location in the liquid repellent region 14 has been described in Step B but the present invention is not limited to the embodiment. The solvent for volatilization rate control may be applied to a plurality of locations in the liquid repellent region so as to surround the lyophilic region. Specifically, as shown in FIG. 2, the ink 18 is applied to the lyophilic region 12 on the substrate 10 and also the solvent 16 for volatilization rate control may be applied to a plurality of locations in the liquid repellent region 14 (at six locations in FIG. 2) so as to surround the lyophilic region 12. By applying the solvent for volatilization rate control to a plurality of locations as described above, the volatilization rate of the first solvent in the ink is easily controlled and the effect of the present invention is further enhanced.

The position to which the solvent for volatilization rate control is applied is not particularly limited but the solvent for volatilization rate control is preferably applied to the liquid repellent region so as to surround the lyophilic region.

The number of locations of the solvent for volatilization rate control applied is not particularly limited but may be 2 or more. Typically, the number of locations is preferably 2 to 10 and more preferably 2 to 8.

The amount of solvent applied at each location of the solvent for volatilization rate control applied is not particularly limited. The amount of solvent applied at each location may be the same or different from each other according to the location. The total amount (total volume) of solvent applied at each solvent application location preferably satisfies a predetermined relationship with the aforementioned volumetric amount of the first solvent in the ink applied to the lyophilic region. That is, it is preferable that the volumetric amount of the first solvent in the ink applied to the lyophilic region is larger than the total volumetric amount of the solvent for volatilization rate control applied to the plurality of locations in the liquid repellent region.

Modification Example 2

As described above, the pattern of the lyophilic region and the liquid repellent region formed on the substrate are not particularly limited. For example, a plurality of lyophilic regions may be formed and the sizes (area) and shapes of the plurality of lyophilic regions may be different from each other.

In Step B, the amount, position, and number of locations of the solvent for volatilization rate control applied in the liquid repellent region may be adjusted according to the size (area) and shape of the lyophilic region. That is, when the solvent for volatilization rate control is applied to the liquid repellent region in the vicinity of the lyophilic region on the substrate having the plurality of lyophilic regions in which at least one of size or shape is different (size and/or shape is different) and the liquid repellent region, according to the sizes and/or shapes of the respective lyophilic regions, at least one of the amount, position, or number of locations of the solvent for volatilization rate control applied can be adjusted.

Figure 3:
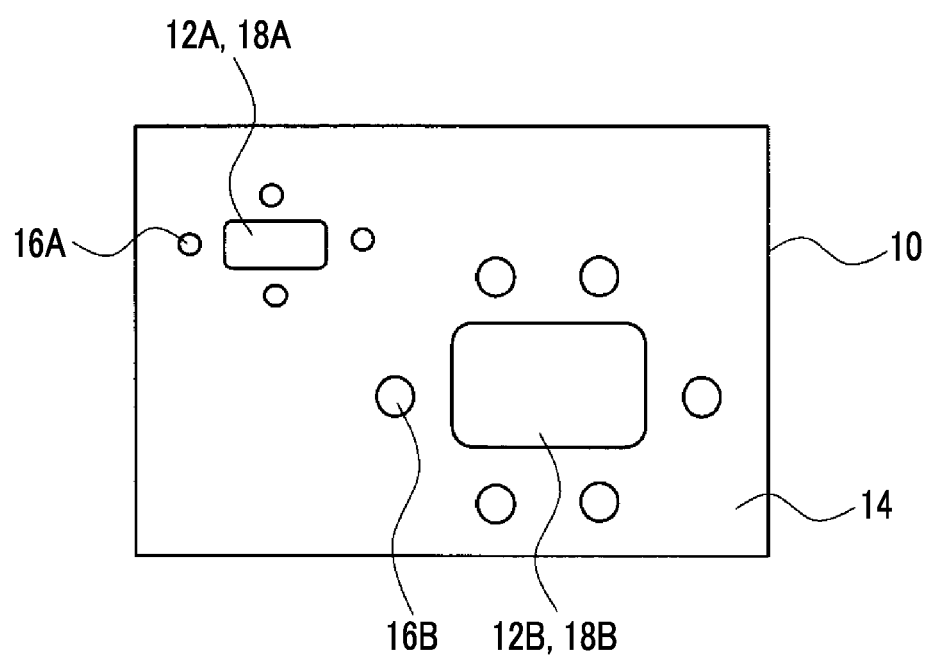
FIG. 3 is a view for illustrating the procedure of Modification Example 2 of the method for producing an organic semiconductor film and is a top view showing a substrate when an ink and a solvent for volatilization rate control are applied to the substrate.

More specifically, in FIG. 3, a lyophilic region 12A and a lyophilic region 12B having two different sizes and a liquid repellent region 14 are formed on the surface of the substrate 10 and an ink 18A and an ink 18B are respectively applied to each of the lyophilic region 12A and the lyophilic region 12B. Since the lyophilic region 12B is larger than the lyophilic region 12A, it is desirable that the solvent for volatilization rate control used to control the volatilization rate of the first solvent in the ink 18B applied to the lyophilic region 12B is applied in a larger amount in the vicinity of the lyophilic region 12B. As shown in FIG. 3, a solvent 16A for volatilization rate control is applied to four locations in the liquid repellent region 14 in the vicinity of the lyophilic region 12A and a solvent 16B for volatilization rate control is applied to six locations in the liquid repellent region 14 in the vicinity of the lyophilic region 12B such that the amount of the solvent 16B applied is larger than the amount of the solvent 16A for volatilization rate control applied. By adjusting at least one of the amount, position, or number of locations of the solvent for volatilization rate control applied according to the size and shape of the lyophilic region in this manner, in each lyophilic region, an organic semiconductor film including organic semiconductor crystals having a large size can be formed at the same time.

Modification Example 3

As described above, the shape of the lyophilic region is not particularly limited and various shapes may be adopted.

Among these, from the viewpoint of further enhancing the effect of the present invention, the lyophilic region preferably has an ink accumulation region and an ink narrowing region (seed crystal precipitation region) connected to the ink accumulation region and having a narrower width than that of the ink accumulation region. More specifically, as shown in FIG. 4, a lyophilic region 120 and a liquid repellent region 14 are disposed on a substrate 100 and the lyophilic region 120 has an ink accumulation region 22 and an ink narrowing region 24.

When the ink is applied to the lyophilic region having two regions as described above, the ink in the ink narrowing region has a narrower width that that of the other region and thus, the solvents (the first solvent and the second solvent) included in the ink easily volatilize. Therefore, an organic semiconductor material is easily precipitated in the ink narrowing region, and once crystals are precipitated, the crystals functions as so-called seed crystals to precipitate an organic semiconductor material around the crystals. Therefore, large organic semiconductor crystals can be easily obtained.

Figure 4:
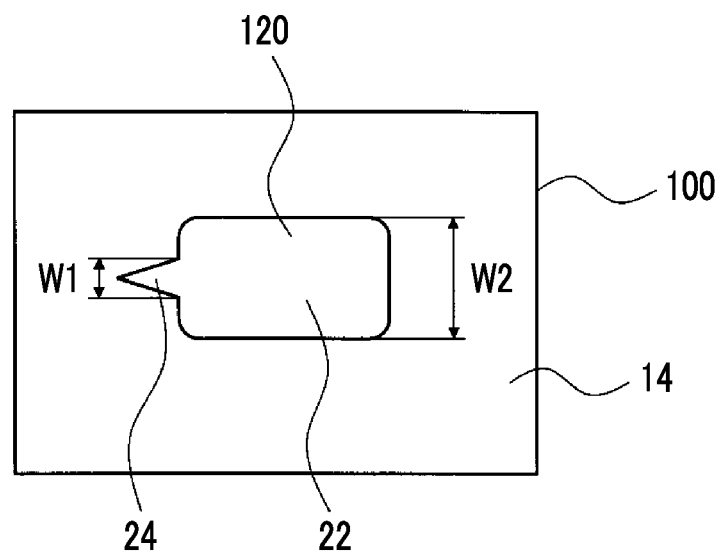
FIG. 4 is a top view showing a substrate for illustrating a lyophilic region used in Modification Example 3 of the method for producing an organic semiconductor film.

The lyophilic region shown in FIG. 4 has an ink narrowing region having an acute location at the boundary with the liquid repellent region and an ink accumulation region (corner-rounded rectangular ink accumulation region) connected to the ink narrowing region, extending from the ink narrowing region in one direction (connection direction), and not having an acute location at the boundary with the liquid repellent region.

The ink accumulation region is a region for accumulating an ink consumed for forming an organic semiconductor film. As shown in FIG. 4, it is preferable that the ink accumulation region does not have an acute location at the boundary with the liquid repellent region. In addition, in the case in which the ink accumulation region has a corner-rounded rectangular shape, the boundary with the liquid repellent region at each corner is preferably formed at an obtuse angle of 130° or more or formed of arcs.

The ink narrowing region is a region for narrowing the ink supplied to ink accumulation region and seed crystals are easily precipitated. The ink narrowing region has a narrower width than that of the ink accumulation region. The width means a length (width) of each region in a direction perpendicular to a direction in which the ink narrowing region is connected with the ink accumulation region. More specifically, as shown in FIG. 4, a width W1 of the ink narrowing region is narrower than a width W2 of the ink accumulation region. As shown in FIG. 4, the width of the ink narrowing region may change or may be constant. However, in the case in which the width of the ink narrowing region changes, the width of the ink narrowing region (maximum width W1) may be narrower than the width of the ink accumulation region.

As shown in FIG. 4, it is preferable that at least one location at the boundary between the ink narrowing region and the liquid repellent region has an acute location. Among these, it is preferable that the width of the ink narrowing region decreases continuously toward the tip end thereof (on the side opposite to the ink accumulation region) and the boundary has an acute location. When such an acute projection portion is provided, seed crystals are easily precipitated at the tip end thereof.

When the ink and the solvent for volatilization rate control are applied to the substrate 100 having the lyophilic region 120, the above-described methods may be adopted. Particularly, when the solvent for volatilization rate control is applied, the solvent for volatilization rate control may be applied to only one location in the liquid repellent region or the solvent for volatilization rate control may be applied to a plurality of locations in the liquid repellent region so as to surround the lyophilic region.

Figure 5:
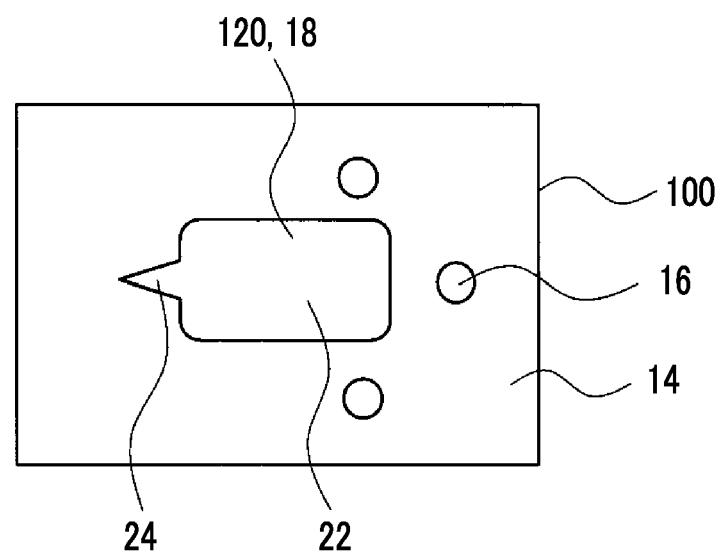
FIG. 5 is a view for illustrating the procedure of Modification Example 3 of the method for producing an organic semiconductor film and is a top view showing a substrate when an ink and a solvent for volatilization rate control are applied to the substrate.

Among these, from the viewpoint of further enhancing the effect of the present invention, it is preferable that the solvent for volatilization rate control is applied to the liquid repellent region on the side close to the ink accumulation region. More specifically, as shown in FIG. 5, the solvent 16 for volatilization rate control is applied to the liquid repellent region 14 on the side close to the ink accumulation region 22. That is, it is preferable that the solvent 16 for volatilization rate control is applied to the liquid repellent region 14 at positions interposing the ink narrowing region 24 and the ink accumulation region 22 therebetween. By unevenly applying the solvent for volatilization rate control to the liquid repellent region on the side close to the ink accumulation region, the volatilization of the solvent (particularly, the first solvent) from the ink accumulation region can be suppressed and first, seed crystals are easily precipitated in the ink narrowing region, thereby further enhancing the effect of the present invention.

In FIG. 5, the solvent 16 for volatilization rate control is applied to three locations but the present invention is not limited to this embodiment. The solvent may be applied to one location, two locations, or four or more locations.

The organic semiconductor film produced by the above-described procedure includes organic semiconductor crystals having a large size and can be suitably used for various applications. Particularly, the organic semiconductor film can be suitably used for an organic semiconductor film of an organic transistor.

EXAMPLES

Examples will be described below but the present invention is not limited to these examples.

Example A (Preparation of Substrate A Having Lyophilic Region and Liquid Repellent Region)

A Si wafer with a 200 nm oxide film was subjected to an UV/$O_3$ treatment and the surface was cleaned and subjected to a lyophilization treatment. Then, the wafer was immersed in a 5% by mass octadecyltrimethoxysilane/toluene solution overnight to make the surface liquid repellent. A metal mask having an opening of a size of 600 μm×100 μm was attached to the liquid repellent surface with magnets and in this state, the substrate was subjected to an UV/$O_3$ treatment again. Then, a lyophilic region corresponding to the opening of the metal mask and a liquid repellent region corresponding to a portion shielded by the metal mask were formed. The contact angle of the ink used in Examples 1 to 24 and Comparative Examples 1 to 12, which will be described later, was less than 15° in the lyophilic region and more than 50° in the liquid repellent region.

Example 1

An organic semiconductor material (TIPS-PEN), a first solvent (toluene), and a second solvent (DMF) shown in Table 1, which will be described later, were mixed and dissolved by performing an ultrasonic treatment for 10 minutes to prepare an ink. The concentration of the organic semiconductor in the ink was 1.0% by mass and the volume of the mixture of the first solvent and the second solvent (volumetric amount of first solvent/volumetric amount of second solvent) was 9.

Separate ink jet heads were respectively filled with a combination of the above-prepared ink and the solvent (toluene) for volatilization rate control shown in Table 1. The jetting volume (volume per one droplet) of each of the ink and the solvent for volatilization rate control was 60 pL and 20 pL, respectively. Regarding the order of jetting, the solvent for volatilization rate control (10 droplets) was first jetted to a predetermined position in the liquid repellent region on the substrate A and immediately after the jetting (before the solvent for volatilization rate control volatilized), the ink (40 droplets) was jetted to the lyophilic region of the substrate A so that the lyophilic region was filled with the ink. The jetting of the solvent for volatilization rate control was performed at six locations so as to surround the lyophilic region as shown in FIG. 2, and 10 droplets of the solvent for volatilization rate control were jetted to each location. Then, the ink was left to stand at room temperature and the first solvent and the second solvent in the ink volatilized and dried within few minutes. Thus, an organic semiconductor film was obtained in the lyophilic region.

Example 2

An organic semiconductor film was produced in the same procedure as in Example 1 except that the number of droplets of the solvent for volatilization rate control was changed to 20 droplets.

Example 3

An organic semiconductor film was produced in the same procedure as in Example 1 except that the droplet position of the solvent for volatilization rate control was set to one location in the vicinity of the lyophilic region as shown in FIG. 1A and the number of droplets of the solvent for volatilization rate control was changed to 60 droplets.

Examples 4, 7, 10, 13, 16, 19, and 22

Organic semiconductor films were produced in the same procedure as in Example 1 except that the types of organic semiconductors, first solvents, second solvents, and solvents for volatilization rate control shown in Table 1 were changed.

Examples 5, 8, 11, 14, 17, 20, and 23

Organic semiconductor films were produced in the same procedure as in Example 2 except that the types of organic semiconductors, first solvents, second solvents, and solvents for volatilization rate control shown in Table 1 were changed.

Examples 6, 9, 12, 15, 18, 21, and 24

Organic semiconductor films were produced in the same procedure as in Example 3 except that the types of organic semiconductors, first solvents, second solvents, and solvents for volatilization rate control shown in Table 1 were changed.

Comparative Examples 1, 3, 4, 6, 7, 9, 10, and 12

Organic semiconductor films were produced in the same procedure as in Example 1 except that the types of organic semiconductors, first solvents, and second solvents shown in Table 1 were changed and solvents for volatilization rate control was not applied to the liquid repellent region.

Comparative Examples 2, 5, 8, and 11

Organic semiconductor films were produced in the same procedure as in Example 1 except that the types of organic semiconductors, first solvents, second solvents, and solvents for volatilization rate control shown in Table 1 were changed.

<Evaluation: Crystal Size (Part 1)>

The organic semiconductor crystals in the organic semiconductor films precipitated in each of Examples and Comparative Examples were observed with a crossed nicols microscope to select crystals having a maximum size in the lyophilic region. The occupancy of the crystals in the lyophilic region {(area of crystals/area of lyophilic region)× 100} was obtained for evaluation. The evaluation standards are as described below and grades A to C are preferable. The results are collectively shown in Table 1.

"A": The occupancy was more than 80%.
"B": The occupancy was more than 65% and equal or less than 80%.
"C": The occupancy was more than 50% and equal to or less than 65%.
"D": The occupancy was equal to or less than 50%.

In Table 1, the column "SP value" indicates the SP values $(MPa)^{1/2}$ of each compound.

In Table 1, in the column "Relationship of boiling point", the case in which the boiling point of the first solvent was higher than the boiling point of the second solvent was denoted by "A" and the case in which the boiling point of the first solvent was equal to or lower than the boiling point of the second solvent was denoted by "B".

In Table 1, in the column "Volumetric amount of solvent for volatilization rate control<volumetric amount of first solvent in ink", the case in which the volumetric amount of the first solvent in the ink was larger than the volumetric amount of the solvent for volatilization rate control applied to the liquid repellent region was denoted by "A", and the case in which the volumetric amount of the first solvent in the ink was equal to or less than the volumetric amount of the solvent for volatilization rate control applied to the liquid repellent region was denoted by "B". In the case in which the solvent for volatilization rate control is applied to a plurality of locations in the liquid repellent region, the volumetric amount of the solvent for volatilization rate control means a total amount of the volumetric amounts of the solvent for volatilization rate control at the respective locations.

In Table 1, in the column "Application location of solvent for volatilization rate control", as shown in FIG. 2, the case in which the solvent for volatilization rate control was applied to a plurality of locations in the liquid repellent region was denoted by "plurality", and as shown in FIG. 1A, the case in which the solvent for volatilization rate control was applied to one location in the liquid repellent region was denoted by "one location".

Each symbol in the column of "Compound" in Table 1 is as follows.

"TIPS-PEN": 6,13-bis(triisopropylsilylethynyl)pentacene
"TES-ADT": 5,11-bis(trimethylsilylethynyl)antradithiophene
"C8-BTBT": 2,7-dioctyl[1]benzothieno[3,2-b][1]benzothiophene
"C8-DNTT": 2,9-dioctyl-dinaphtho[2,3-b:2'3'-f]thieno[3,2-b]thiophene
"o-DCB": o-dichlorobenzene
"2BE": 2-butoxyethanol
"CyH": cyclohexanol
"DMF": dimethylformamide
"13BG": 1,3-butanediol
"DMSO": dimethylsulfoxide
"12PG": 1,2-propanediol

TABLE 1

| | Organic semiconductor | | First solvent | | | | Second Solvent | |
|---|---|---|---|---|---|---|---|---|
| | Type | SP value | Type | SP value | Boiling point (° C.) | Surface tension (mN/N) | Type | SP value |
| Example 1 | TIPS-PEN | 19.4 | Toluene | 18.2 | 110 | 27.9 | DMF | 24.9 |
| Example 2 | TIPS-PEN | 19.4 | Toluene | 18.2 | 110 | 27.9 | DMF | 24.9 |
| Example 3 | TIPS-PEN | 19.4 | Toluene | 18.2 | 110 | 27.9 | DMF | 24.9 |
| Example 4 | TIPS-PEN | 19.4 | o-DCB | 20.5 | 180 | 36.6 | 13BG | 28.9 |
| Example 5 | TIPS-PEN | 19.4 | o-DCB | 20.5 | 180 | 36.6 | 13BG | 28.9 |
| Example 6 | TIPS-PEN | 19.4 | o-DCB | 20.5 | 180 | 36.6 | 13BG | 28.9 |
| Example 7 | TES-ADT | 19.7 | 2BE | 20.8 | 171 | 26.6 | 13BG | 28.9 |
| Example 8 | TES-ADT | 19.7 | 2BE | 20.8 | 171 | 26.6 | 13BG | 28.9 |

TABLE 1-continued

| | | | | | | | | |
|---|---|---|---|---|---|---|---|---|
| Example 9 | TES-ADT | 19.7 | 2BE | 20.8 | 171 | 26.6 | 13BG | 28.9 |
| Example 10 | TES-ADT | 19.7 | Tetralin | 19.9 | 205 | 35.5 | 13BG | 28.9 |
| Example 11 | TES-ADT | 19.7 | Tetralin | 19.9 | 205 | 35.5 | 13BG | 28.9 |
| Example 12 | TES-ADT | 19.7 | Tetralin | 19.9 | 205 | 35.5 | 13BG | 28.9 |
| Example 13 | C8-BTBT | 20.2 | Chlorobenzene | 19.4 | 131 | 32.7 | DMF | 24.9 |
| Example 14 | C8-BTBT | 20.2 | Chlorobenzene | 19.4 | 131 | 32.7 | DMF | 24.9 |
| Example 15 | C8-BTBT | 20.2 | Chlorobenzene | 19.4 | 131 | 32.7 | DMF | 24.9 |
| Example 16 | C8-BTBT | 20.2 | o-DCB | 20.5 | 180 | 36.6 | DMSO | 26.7 |
| Example 17 | C8-BTBT | 20.2 | o-DCB | 20.5 | 180 | 36.6 | DMSO | 26.7 |
| Example 18 | C8-BTBT | 20.2 | o-DCB | 20.5 | 180 | 36.6 | DMSO | 26.7 |
| Example 19 | C8-DNTT | 21.8 | Benzaldehyde | 21.4 | 179 | 38.3 | 12PG | 31.3 |
| Example 20 | C8-DNTT | 21.8 | Benzaldehyde | 21.4 | 179 | 38.3 | 12PG | 31.3 |
| Example 21 | C8-DNTT | 21.8 | Benzaldehyde | 21.4 | 179 | 38.3 | 12PG | 31.3 |
| Example 22 | C8-DNTT | 21.8 | CyH | 22.4 | 161 | 33.4 | Hexadecane | 16.3 |
| Example 23 | C8-DNTT | 21.8 | CyH | 22.4 | 161 | 33.4 | Hexadecane | 16.3 |
| Example 24 | C8-DNTT | 21.8 | CyH | 22.4 | 161 | 33.4 | Hexadecane | 16.3 |
| Comparative Example 1 | TIPS-PEN | 19.4 | Toluene | 18.2 | 110 | 27.9 | DMF | 24.9 |
| Comparative Example 2 | TIPS-PEN | 19.4 | Anisole | 19.5 | 154 | 34.6 | DMF | 24.9 |
| Comparative Example 3 | TIPS-PEN | 19.4 | Anisole | 19.5 | 154 | 34.6 | DMF | 24.9 |
| Comparative Example 4 | TES-ADT | 19.7 | 2BE | 20.8 | 171 | 26.6 | 13BG | 28.9 |
| Comparative Example 5 | TES-ADT | 19.7 | 2BE | 20.8 | 171 | 26.6 | DMF | 24.9 |
| Comparative Example 6 | TES-ADT | 19.7 | 2BE | 20.8 | 171 | 26.6 | DMF | 24.9 |
| Comparative Example 7 | C8-BTBT | 20.2 | Chlorobenzene | 19.4 | 131 | 32.7 | DMF | 24.9 |
| Comparative Example 8 | C8-BTBT | 20.2 | o-DCB | 20.5 | 180 | 36.6 | DMF | 24.9 |
| Comparative Example 9 | C8-BTBT | 20.2 | o-DCB | 20.5 | 180 | 36.6 | DMF | 24.9 |
| Comparative Example 10 | C8-DNTT | 21.8 | Benzaldehyde | 21.4 | 179 | 38.3 | 12PG | 31.3 |
| Comparative Example 11 | C8-DNTT | 21.8 | 2BE | 20.8 | 171 | 26.6 | DMF | 24.9 |
| Comparative Example 12 | C8-DNTT | 21.8 | 2BE | 20.8 | 171 | 26.6 | DMF | 24.9 |

| | Second Solvent | | | | Volumetric amount of solvent for volatilization rate control < volumetric amount of first solvent in ink | Application location of solvent for volatilization rate control | Crystal size |
|---|---|---|---|---|---|---|---|
| | Boiling point (° C.) | Surface tension (mN/N) | Solvent for volatilization rate control | Relationship of boiling point | | | |
| Example 1 | 151 | 34.4 | Toluene | A | A | Plurality | A |
| Example 2 | 151 | 34.4 | Toluene | A | B | Plurality | C |
| Example 3 | 151 | 34.4 | Toluene | A | A | One location | C |
| Example 4 | 208 | 47.1 | o-DCB | A | A | Plurality | A |
| Example 5 | 208 | 47.1 | o-DCB | A | B | Plurality | C |
| Example 6 | 208 | 47.1 | o-DCB | A | A | One location | C |
| Example 7 | 208 | 47.1 | 2BE | A | A | Plurality | A |
| Example 8 | 208 | 47.1 | 2BE | A | B | Plurality | C |
| Example 9 | 208 | 47.1 | 2BE | A | A | One location | C |
| Example 10 | 208 | 47.1 | Tetralin | A | A | Plurality | A |
| Example 11 | 208 | 47.1 | Tetralin | A | B | Plurality | C |
| Example 12 | 208 | 47.1 | Tetralin | A | A | One location | C |
| Example 13 | 151 | 34.4 | Chlorobenzene | A | A | Plurality | A |
| Example 14 | 151 | 34.4 | Chlorobenzene | A | B | Plurality | C |
| Example 15 | 151 | 34.4 | Chlorobenzene | A | A | One location | C |
| Example 16 | 189 | 42.9 | o-DCB | A | A | Plurality | A |
| Example 17 | 189 | 42.9 | o-DCB | A | B | Plurality | C |
| Example 18 | 189 | 42.9 | o-DCB | A | A | One location | C |
| Example 19 | 188 | 45.6 | o-DCB | A | A | Plurality | A |
| Example 20 | 188 | 45.6 | o-DCB | A | B | Plurality | C |
| Example 21 | 188 | 45.6 | o-DCB | A | A | One location | C |
| Example 22 | 287 | 27.1 | CyH | A | A | Plurality | A |
| Example 23 | 287 | 27.1 | CyH | A | B | Plurality | C |
| Example 24 | 287 | 27.1 | CyH | A | A | One location | C |
| Comparative Example 1 | 151 | 34.4 | — | A | — | — | D |
| Comparative Example 2 | 151 | 34.4 | Anisole | B | A | Plurality | D |

TABLE 1-continued

| | | | | | | | |
|---|---|---|---|---|---|---|---|
| Comparative Example 3 | 151 | 34.4 | — | B | — | — | D |
| Comparative Example 4 | 208 | 47.1 | — | A | — | — | D |
| Comparative Example 5 | 151 | 34.4 | 2BE | B | A | Plurality | D |
| Comparative Example 6 | 151 | 34.4 | — | B | — | — | D |
| Comparative Example 7 | 151 | 34.4 | — | A | — | — | D |
| Comparative Example 8 | 151 | 34.4 | o-DCB | B | A | Plurality | D |
| Comparative Example 9 | 151 | 34.4 | — | B | — | — | D |
| Comparative Example 10 | 188 | 45.6 | — | A | — | — | D |
| Comparative Example 11 | 151 | 34.4 | 2BE | B | A | Plurality | D |
| Comparative Example 12 | 151 | 34.4 | — | B | — | — | D |

As shown in Table 1, according to the method for producing an organic semiconductor film of the present invention, it was confirmed that organic semiconductor films including larger organic semiconductor crystals could be obtained.

Among these, in comparison of Examples 1 and 2, it was confirmed that in the case in which the volumetric amount of the first solvent in the ink applied to the lyophilic region was larger than the volumetric amount of the solvent for volatilization rate control applied to the liquid repellent region, a further enhanced effect could be obtained.

In addition, in comparison of Examples 1 and 3, it was confirmed that in the case in which the solvent for volatilization rate control was applied to a plurality of locations in the liquid repellent region, a further enhanced effect could be obtained.

On the other hand, as shown in Comparative Examples, it was confirmed that in the case in which the solvent for volatilization rate control was not used or the relationship between the boiling point of the first solvent and the boiling point of the second solvent was not satisfied, a desired effect could not be obtained.

Example B (Preparation of Substrate B Having Lyophilic Region and Liquid Repellent Region)

A Si wafer with a 200 nm oxide film was subjected to an UV/O$_3$ treatment and the surface was cleaned and subjected to a lyophilization treatment. Then, the wafer was immersed in a 5% by mass octadecyltrimethoxysilane/toluene solution overnight to make the surface liquid repellent. A metal mask having openings of sizes of 600 μm×100 μm and 300 μm×50 μm was attached to the liquid repellent surface with magnets and in this state, the substrate was subjected to an UV/O$_3$ treatment again. Then, a lyophilic region X (600 μm×100 μm) and a lyophilic region Y (300 μm×50 μm) corresponding to the openings of the metal mask and a liquid repellent region corresponding to a portion shielded by the metal mask were formed.

Example 31

Separate ink jet heads were respectively filled with a combination of the ink used in Example 1 and the solvent (toluene) for volatilization rate control shown in Table 2. The jetting volume (volume per one droplet) of each of the ink and the solvent for volatilization rate control was 60 pL and 20 pL, respectively. Regarding the order of jetting, the solvent for volatilization rate control was first jetted to a predetermined position in the liquid repellent region on the substrate B. At this time, as shown in FIG. 3, the solvent for volatilization rate control was applied to six locations so as to surround the lyophilic region X and 10 droplets of the solvent for volatilization rate control were jetted to each location. In addition, the solvent for volatilization rate control was applied to four locations at the same time so as to surround the lyophilic region Y and 4 droplets of the solvent for volatilization rate control were jetted to each location. Immediately after the solvent for volatilization rate control was applied (before the solvent for volatilization rate control volatilized), the ink was jetted to the lyophilic region X (28 droplets) and the lyophilic region Y (7 droplets) of the substrate B so that each region was filled with the ink. Then, the ink was left to stand at room temperature and the first solvent and the second solvent in the ink volatilized and dried within few minutes. Thus, an organic semiconductor film was obtained in the lyophilic region X and the lyophilic region Y.

Example 32

An organic semiconductor film was produced in the same procedure as in Example 31 except that in the same manner that the solvent for volatilization rate control was applied to the vicinity of the lyophilic region Y, the solvent for volatilization rate control was applied to four locations so as to surround the lyophilic region X and 4 droplets of the solvent for volatilization rate control were jetted to each location.

In the example, the method for applying the solvent for volatilization rate control to the vicinity of the lyophilic region X is the same as the method for the solvent for volatilization rate control to the vicinity of the lyophilic region Y.

Examples 33, 35, 37, 39, 41, 43, and 45

Organic semiconductor films were produced in the same procedure as in Example 31 except that the types of organic semiconductors, first solvents, second solvents, and solvents for volatilization rate control shown in Table 1 were changed.

Examples 34, 36, 38, 40, 42, 44, and 46

Organic semiconductor films were produced in the same procedure as in Example 32 except that the types of organic semiconductors, first solvents, second solvents, and solvents for volatilization rate control shown in Table 1 were changed.

<Evaluation: Crystal Size (Part 2)>

The organic semiconductor crystals in the organic semiconductor films precipitated in each of Examples were observed with a crossed nicols microscope to select crystals having a maximum size in the lyophilic region X. The occupancy of the crystals in the lyophilic region X {(area of crystals/area of lyophilic region X)×100} was obtained for evaluation.

Further, the occupancy in the lyophilic region Y was obtained according to the same procedure as described above.

The respective occupancies in the lyophilic region X and the lyophilic region Y were evaluated based on the following standards. The results are collectively shown in Table 2.

"A": The occupancy was more than 80% in both the lyophilic region X and the lyophilic region Y.

"B": The occupancy was more than 65% and equal to or less than 80% in at least one of the lyophilic region X or the lyophilic region Y.

"C": The occupancy was more than 50% and equal to or less than 65% in at least one of the lyophilic region X or the lyophilic region Y.

"D": The occupancy was equal to or less than 50% in at least one of the lyophilic region X or the lyophilic region Y.

In Table 2, in the column "Application method according to pattern shape", the case in which the amount and number of locations of the solvent for volatilization rate control applied were changed according to the size of the lyophilic region X and the lyophilic region Y was denoted by "A", and the case in which the amount and number of locations of the solvent for volatilization rate control applied to the vicinities of the respective lyophilic region X and lyophilic region Y were the same was denoted by "B".

TABLE 2

| | Organic semiconductor | | First solvent | | | | Second Solvent | | | | Solvent for volatilization rate control | Application method according to pattern shape | Crystal size |
|---|---|---|---|---|---|---|---|---|---|---|---|---|---|
| | Type | SP value | Type | SP value | Boiling point (° C.) | Surface tension (mN/N) | Type | SP value | Boiling point (° C.) | Surface tension (mN/N) | | | |
| Example 31 | TIPS-PEN | 19.4 | Toluene | 18.2 | 110 | 27.9 | DMF | 24.9 | 151 | 34.4 | Toluene | A | A |
| Example 32 | TIPS-PEN | 19.4 | Toluene | 18.2 | 110 | 27.9 | DMF | 24.9 | 151 | 34.4 | Toluene | B | B |
| Example 33 | TIPS-PEN | 19.4 | o-DCB | 20.5 | 180 | 36.6 | 13BG | 28.9 | 208 | 47.1 | o-DCB | A | A |
| Example 34 | TIPS-PEN | 19.4 | o-DCB | 20.5 | 180 | 36.6 | 13BG | 28.9 | 208 | 47.1 | o-DCB | B | B |
| Example 35 | TES-ADT | 19.7 | 2BE | 20.8 | 171 | 26.6 | 13BG | 28.9 | 208 | 47.1 | 2BE | A | A |
| Example 36 | TES-ADT | 19.7 | 2BE | 20.8 | 171 | 26.6 | 13BG | 28.9 | 208 | 47.1 | 2BE | B | B |
| Example 37 | TES-ADT | 19.7 | Tetralin | 19.9 | 205 | 35.5 | 13BG | 28.9 | 208 | 47.1 | Tetralin | A | A |
| Example 38 | TES-ADT | 19.7 | Tetralin | 19.9 | 205 | 35.5 | 13BG | 28.9 | 208 | 47.1 | Tetralin | B | B |
| Example 39 | C8-BTBT | 20.2 | Chlorobenzene | 19.4 | 131 | 32.7 | DMF | 24.9 | 151 | 34.4 | Chlorobenzene | A | A |
| Example 40 | C8-BTBT | 20.2 | Chlorobenzene | 19.4 | 131 | 32.7 | DMF | 24.9 | 151 | 34.4 | Chlorobenzene | B | B |
| Example 41 | C8-BTBT | 20.2 | o-DCB | 20.5 | 180 | 36.6 | DMSO | 26.7 | 189 | 42.9 | o-DCB | A | A |
| Example 42 | C8-BTBT | 20.2 | o-DCB | 20.5 | 180 | 36.6 | DMSO | 26.7 | 189 | 42.9 | o-DCB | B | B |
| Example 43 | C8-DNTT | 21.8 | Benzaldehyde | 21.4 | 179 | 38.3 | 12PG | 31.3 | 188 | 45.6 | Benzaldehyde | A | A |
| Example 44 | C8-DNTT | 21.8 | Benzaldehyde | 21.4 | 179 | 38.3 | 12PG | 31.3 | 188 | 45.6 | Benzaldehyde | B | B |
| Example 45 | C8-DNTT | 21.8 | CyH | 22.4 | 161 | 33.4 | Hexadecane | 16.3 | 287 | 27.1 | CyH | A | A |
| Example 46 | C8-DNTT | 21.8 | CyH | 22.4 | 161 | 33.4 | Hexadecane | 16.3 | 287 | 27.1 | CyH | B | B |

As shown in Table 2, in the case in which the amount and number of locations of the solvent for volatilization rate control applied were changed according to the size of the lyophilic region, an organic semiconductor film including organic semiconductor crystals having a larger size was obtained in both the lyophilic regions X and the Y.

Example C (Preparation of Substrate C Having Lyophilic Region and Liquid Repellent Region)

A Si wafer with a 200 nm oxide film was subjected to an UV/O$_3$ treatment and the surface was cleaned and subjected to a lyophilization treatment. Then, the wafer was immersed in a 5% by mass octadecyltrimethoxysilane/toluene solution overnight to make the surface liquid repellent. A metal mask having an opening having the shape of a lyophilic region shown in FIG. 4 was attached to the liquid repellent surface with magnets and in this state, the substrate was subjected to an UV/O₃ treatment again. Then, a lyophilic region corresponding to the opening of the metal mask and a liquid repellent region corresponding to a portion shielded by the metal mask were formed. The size of the ink accumulation region of the opening was 600 μm×100 μm, W2 was 100 μm, the width W1 of the ink narrowing region was 30 μm, and the length (the length in a direction perpendicular to the width W1) was 50 μm.

Example 51

Separate ink jet heads were respectively filled with a combination of the ink used in Example 1 and the solvent (toluene) for volatilization rate control shown in Table 3. The jetting volume (volume per one droplet) of each of the ink and the solvent for volatilization rate control was 60 pL and 20 pL, respectively. Regarding the order of jetting, the solvent for volatilization rate control was first jetted to a predetermined position in the liquid repellent region on the substrate C. At this time, as shown in FIG. 5, the solvent for volatilization rate control was applied to three locations in the lyophilic region on the side close to the ink accumulation region, and 25 droplets of the solvent for volatilization rate control were jetted to each location. Immediately after the solvent for volatilization rate control was applied (before the solvent for volatilization rate control volatilized), the ink (24 droplets) was jetted to the lyophilic region of the substrate C so that the lyophilic region was filled with the ink. Then, the ink was left to stand at room temperature and the first solvent and the second solvent in the ink volatilized and dried within few minutes. Thus, an organic semiconductor film was obtained in the lyophilic region.

In the example, the volumetric amount of the first solvent in the ink applied to the lyophilic region was smaller than the volumetric amount of the solvent for volatilization rate control applied in the liquid repellent region.

Example 52

Figure 6:
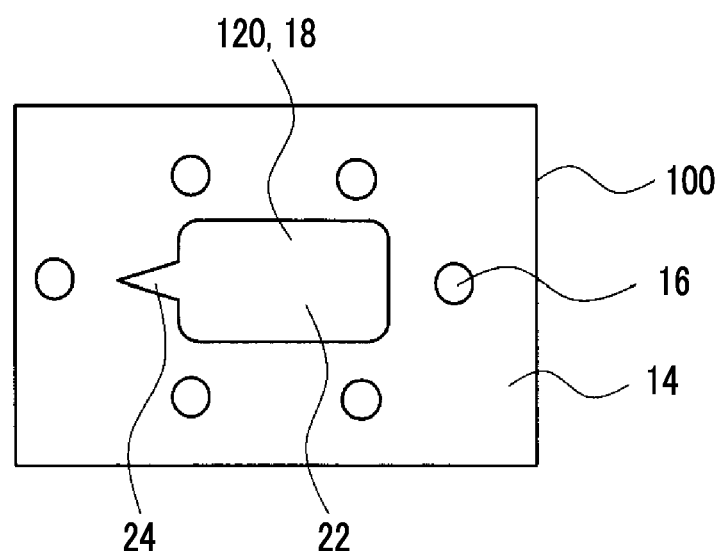
FIG. 6 is a view for illustrating the procedure when a solvent for volatilization rate control is applied, which is performed in Example 52, and is a top view showing a substrate when an ink and the solvent for volatilization rate control are applied to the substrate.

An organic semiconductor film was produced in the same procedure as in Example 51 except that as shown in FIG. 6, the solvent for volatilization rate control was applied to six locations in the liquid repellent region so as to surround the lyophilic region and 12 droplets of the solvent for volatilization rate control were jetted to each location.

In FIG. 6, an embodiment in which the ink 18 is applied to the lyophilic region 120 of the substrate 100 having the lyophilic region 120 and the liquid repellent region 14 and the solvent 16 for volatilization rate control was applied so as to surround the lyophilic region 120 is shown.

Examples 53, 55, 57, 59, 61, 63, and 65

An organic semiconductor film was produced in the same procedure as in Example 51 except that the types of organic semiconductors, first solvents, second solvents, and solvents for volatilization rate control shown in Table 1 were changed.

Examples 54, 56, 58, 60, 62, 64, and 66

An organic semiconductor film was produced in the same procedure as in Example 52 except that the types of organic semiconductors, first solvents, second solvents, and solvents for volatilization rate control shown in Table 1 were changed.

<Evaluation: Crystal Size (Part 3)>

The organic semiconductor crystals in the organic semiconductor films precipitated in each of Examples were observed with a crossed nicols microscope to select crystals having a maximum size in the lyophilic region. The occupancy of the crystals in the lyophilic region X {(area of crystals/area of lyophilic region)×100} was obtained for evaluation. The evaluation standards are as described below and grades A to C are preferable. The results are collectively shown in Table 3.

"A": The occupancy was more than 80%.
"B": The occupancy was more than 65% and equal or less than 80%.
"C": The occupancy was more than 50% and equal to or less than 65%.
"D": The occupancy was equal to or less than 50%.

In Table 3, in the column "Application pattern", as shown in FIG. 5, the case in which the solvent for volatilization rate control was applied to only the liquid repellent region on one region side of the lyophilic region was denoted by "A" and as shown in FIG. 6, the case in which the solvent for volatilization rate control was applied so as to surround the lyophilic region was denoted by "B".

TABLE 3

| | Organic semiconductor | | First solvent | | | | Second Solvent | | | | | | |
|---|---|---|---|---|---|---|---|---|---|---|---|---|---|
| | Type | SP value | Type | SP value | Boiling point (° C.) | Surface tension (mN/N) | Type | SP value | Boiling point (° C.) | Surface tension (mN/N) | Solvent for volatilization rate control | Application pattern | Crystal size |
| Example 51 | TIPS-PEN | 19.4 | Toluene | 18.2 | 110 | 27.9 | DMF | 24.9 | 151 | 34.4 | Toluene | A | A |
| Example 52 | TIPS-PEN | 19.4 | Toluene | 18.2 | 110 | 27.9 | DMF | 24.9 | 151 | 34.4 | Toluene | B | B |
| Example 53 | TIPS-PEN | 19.4 | o-DCB | 20.5 | 180 | 36.6 | 13BG | 28.9 | 208 | 47.1 | o-DCB | A | A |
| Example 54 | TIPS-PEN | 19.4 | o-DCB | 20.5 | 180 | 36.6 | 13BG | 28.9 | 208 | 47.1 | o-DCB | B | B |
| Example 55 | TES-ADT | 19.7 | 2BE | 20.8 | 171 | 26.6 | 13BG | 28.9 | 208 | 47.1 | 2BE | A | A |
| Example 56 | TES-ADT | 19.7 | 2BE | 20.8 | 171 | 26.6 | 13BG | 28.9 | 208 | 47.1 | 2BE | B | B |
| Example 57 | TES-ADT | 19.7 | Tetralin | 19.9 | 205 | 35.5 | 13BG | 28.9 | 208 | 47.1 | Tetralin | A | A |

TABLE 3-continued

| | Organic semiconductor | | First solvent | | | | Second Solvent | | | | Solvent for volatilization rate control | Application pattern | Crystal size |
|---|---|---|---|---|---|---|---|---|---|---|---|---|---|
| | Type | SP value | Type | SP value | Boiling point (° C.) | Surface tension (mN/N) | Type | SP value | Boiling point (° C.) | Surface tension (mN/N) | | | |
| Example 58 | TES-ADT | 19.7 | Tetralin | 19.9 | 205 | 35.5 | 13BG | 28.9 | 208 | 47.1 | Tetralin | B | B |
| Example 59 | C8-BTBT | 20.2 | Chlorobenzene | 19.4 | 131 | 32.7 | DMF | 24.9 | 151 | 34.4 | Chlorobenzene | A | A |
| Example 60 | C8-BTBT | 20.2 | Chlorobenzene | 19.4 | 131 | 32.7 | DMF | 24.9 | 151 | 34.4 | Chlorobenzene | B | B |
| Example 61 | C8-BTBT | 20.2 | o-DCB | 20.5 | 180 | 36.6 | DMSO | 26.7 | 189 | 42.9 | o-DCB | A | A |
| Example 62 | C8-BTBT | 20.2 | o-DCB | 20.5 | 180 | 36.6 | DMSO | 26.7 | 189 | 42.9 | o-DCB | B | B |
| Example 63 | C8-DNTT | 21.8 | Benzaldehyde | 21.4 | 179 | 38.3 | 12PG | 31.3 | 188 | 45.6 | Benzaldehyde | A | A |
| Example 64 | C8-DNTT | 21.8 | Benzaldehyde | 21.4 | 179 | 38.3 | 12PG | 31.3 | 188 | 45.6 | Benzaldehyde | B | B |
| Example 65 | C8-DNTT | 21.8 | CyH | 22.4 | 161 | 33.4 | Hexadecane | 16.3 | 287 | 27.1 | CyH | A | A |
| Example 66 | C8-DNTT | 21.8 | CyH | 22.4 | 161 | 33.4 | Hexadecane | 16.3 | 287 | 27.1 | CyH | B | B |

As shown in Table 3, in the case in which the solvent for volatilization rate control was unevenly applied toward the ink accumulation region, an organic semiconductor film including organic semiconductor crystals having a larger size was obtained.

EXPLANATION OF REFERENCES 10, 100: substrate
12, 12A, 12B, 120: lyophilic region
14: liquid repellent region
16, 16A, 16B: solvent for volatilization rate control
18, 18A, 18B: ink
20: organic semiconductor film
22: ink accumulation region
24: ink narrowing region

What is claimed is:

1. A method for producing an organic semiconductor film comprising:
performing, in random order,
a step of applying an ink including an organic semiconductor, a first solvent having a high affinity for the organic semiconductor, and a second solvent having a lower affinity for the organic semiconductor than that of the first solvent and having a higher boiling point than that of the first solvent, to a lyophilic region of a substrate having at least one of a lyophilic region or a liquid repellent region disposed in the vicinity of the lyophilic region on a surface, and
a step of applying a solvent for volatilization rate control composed of the same type of solvent as the first solvent in the ink and used for controlling a volatilization rate of the first solvent in the ink applied to the lyophilic region to the liquid repellent region of the substrate; and
then performing a step of causing the first solvent and the second solvent in the ink applied to the lyophilic region to volatilize to produce organic semiconductor film.

2. The method for producing an organic semiconductor film according to claim 1,
wherein a volumetric amount of the first solvent in the ink applied to the lyophilic region is larger than a volumetric amount of the solvent for volatilization rate control applied to the liquid repellent region.

3. The method for producing an organic semiconductor film according to claim 1,
wherein a plurality of the lyophilic regions having different sizes and/or shapes are disposed on the substrate, and when the solvent for volatilization rate control is applied to the liquid repellent region in the vicinities of the respective lyophilic regions, at least one of the amount, position, or number of locations of the solvent for volatilization rate control applied is adjusted according to the sizes and/or shapes of the lyophilic regions.

4. The method for producing an organic semiconductor film according to claim 1,
wherein the solvent for volatilization rate control is applied to a plurality of locations in the liquid repellent region so as to surround the lyophilic region.

5. The method for producing an organic semiconductor film according to claim 1,
wherein the lyophilic region has an ink accumulation region and an ink narrowing region connected to the ink accumulation region and having a narrower width than that of the ink accumulation region.

6. The method for producing an organic semiconductor film according to claim 5,
wherein at least one location at a boundary between the ink narrowing region and the liquid repellent region is an acute location, and a boundary between the ink accumulation region and the liquid repellent region does not include an acute location.

7. The method for producing an organic semiconductor film according to claim 5,
wherein the solvent for volatilization rate control is applied to the liquid repellent region on the side close to the ink accumulation region.

8. The method for producing an organic semiconductor film according to claim 1,
wherein the application of the ink and the application of the solvent for volatilization rate control are performed by an ink jet method.

9. An organic transistor comprising:
an organic semiconductor film produced by the production method according to claim 1.

10. The method for producing an organic semiconductor film according to claim 2,
wherein a plurality of the lyophilic regions having different sizes and/or shapes are disposed on the substrate, and when the solvent for volatilization rate control is applied to the liquid repellent region in the vicinities of the respective lyophilic regions, at least one of the amount, position, or number of locations of the solvent for volatilization rate control applied is adjusted according to the sizes and/or shapes of the lyophilic regions.

11. The method for producing an organic semiconductor film according to claim 2,
wherein the solvent for volatilization rate control is applied to a plurality of locations in the liquid repellent region so as to surround the lyophilic region.

12. The method for producing an organic semiconductor film according to claim 3,
wherein the solvent for volatilization rate control is applied to a plurality of locations in the liquid repellent region so as to surround the lyophilic region.

13. The method for producing an organic semiconductor film according to claim 2,
wherein the lyophilic region has an ink accumulation region and an ink narrowing region connected to the ink accumulation region and having a narrower width than that of the ink accumulation region.

14. The method for producing an organic semiconductor film according to claim 3,
wherein the lyophilic region has an ink accumulation region and an ink narrowing region connected to the ink accumulation region and having a narrower width than that of the ink accumulation region.

15. The method for producing an organic semiconductor film according to claim 4,
wherein the lyophilic region has an ink accumulation region and an ink narrowing region connected to the ink accumulation region and having a narrower width than that of the ink accumulation region.

16. The method for producing an organic semiconductor film according to claim 6,
wherein the solvent for volatilization rate control is applied to the liquid repellent region on the side close to the ink accumulation region.

17. The method for producing an organic semiconductor film according to claim 2,
wherein the application of the ink and the application of the solvent for volatilization rate control are performed by an ink jet method.

18. The method for producing an organic semiconductor film according to claim 3,
wherein the application of the ink and the application of the solvent for volatilization rate control are performed by an ink jet method.

19. The method for producing an organic semiconductor film according to claim 4,
wherein the application of the ink and the application of the solvent for volatilization rate control are performed by an ink jet method.

20. The method for producing an organic semiconductor film according to claim 5,
wherein the application of the ink and the application of the solvent for volatilization rate control are performed by an ink jet method.

* * * * *